United States Patent
Erickson

(10) Patent No.: US 9,529,041 B2
(45) Date of Patent: Dec. 27, 2016

(54) METHOD FOR TESTING THROUGH-SILICON VIAS AT WAFER SORT USING ELECTRON BEAM DEFLECTION

(71) Applicant: Brian D. Erickson, Soquel, CA (US)

(72) Inventor: Brian D. Erickson, Soquel, CA (US)

( * ) Notice: Subject to any disclaimer, the term of this patent is extended or adjusted under 35 U.S.C. 154(b) by 294 days.

(21) Appl. No.: 14/071,573

(22) Filed: Nov. 4, 2013

(65) Prior Publication Data

US 2014/0125369 A1 May 8, 2014

Related U.S. Application Data

(60) Provisional application No. 61/722,738, filed on Nov. 5, 2012.

(51) Int. Cl.
| | | |
|---|---|---|
| *G01R 31/305* | (2006.01) | |
| *G01R 31/02* | (2006.01) | |
| *G01R 31/307* | (2006.01) | |

(52) U.S. Cl.
CPC ............ *G01R 31/307* (2013.01); *G01R 31/02* (2013.01)

(58) Field of Classification Search
CPC . G01R 31/307; G01R 31/2853; G01R 31/311; G01R 31/2884; G01R 31/2831; H01L 22/34; H01L 22/12; H01L 21/67253; H01L 23/5226; H01L 21/02074; H01L 21/76802; H01L 22/14; G01N 23/225; G01N 23/00; G01N 21/9501; G01N 23/203; G01N 21/66; G01N 21/956; G01N 23/22; G01N 23/223
See application file for complete search history.

(56) References Cited

U.S. PATENT DOCUMENTS

| | | | | |
|---|---|---|---|---|
| 5,493,236 A | * | 2/1996 | Ishii | ................... G01R 31/2656 324/501 |
| 6,417,680 B1 | * | 7/2002 | Birdsley | .............. G01R 31/311 324/754.23 |
| 6,946,857 B2 | * | 9/2005 | Yamada | ............... G01R 31/307 324/754.22 |

* cited by examiner

*Primary Examiner* — Vinh Nguyen
(74) *Attorney, Agent, or Firm* — Bever, Hoffman & Harms, LLP

(57) ABSTRACT

Through-silicon vias (TSVs) are tested using a modified integrated circuit test probe array, an electron beam generation device, a beam direction control device and an electron beam detection device. The TSV extends through a silicon substrate with end portions exposed or accessible by contacts disposed on opposing upper and lower surfaces of the substrate. The test probe array includes a test probe that accesses the lower TSV end portion and applies an AC test signal. An electron beam is directed by the beam direction control device onto the upper substrate surface such that a beam portion reflected from the upper TSV end portion is captured by the electron beam detection device. Reflected beam data is then analyzed to verify the TSV is properly formed. Various scan patterns, different test signal frequencies and an optional resistive coating are used to enhance the TSV testing process.

10 Claims, 6 Drawing Sheets

METHOD FOR TESTING THROUGH-SILICON VIAS AT WAFER SORT USING ELECTRON BEAM DEFLECTION

RELATED APPLICATIONS

This application claims priority to U.S. Provisional Patent Application 61/722,738, entitled "METHOD AND STRUCTURE FOR PROVIDING REDUCED CONTACT TESTING AT WAFER SORT USING ELECTRON BEAM DEFLECTION" filed Nov. 5, 2012.

FIELD OF THE INVENTION

The present invention related to integrated circuits, and more particularly to methods for testing integrated circuit wafers including to through-silicon vias (TSVs) assure proper operation prior to assembly.

BACKGROUND OF THE INVENTION

FIG. 7 shows a simplified semiconductor device disposed in a three-dimensional (3D) package arrangement including two silicon chips 10-1 and 10-2 that are stacked vertically and separated by an insulating layer 13. Silicon chip 10-1 and 10-2 respectively include integrated circuits (ICs) 20-1 and 20-2 fabricated thereon using conventional (e.g., CMOS) fabrication processes, with IC 20-1 being connected by conventional metal wiring structures to contact pads 17 and to a conductor 18-1, and IC 20-2 being connected to a conductor 18-2. In most 3D packages, the stacked chips are wired together along their edges; this edge wiring slightly increases the length and width of the package and usually requires an extra "interposer" layer between the chips. To avoid these edge-wiring issues, the 3D package arrangement shown in FIG. 7 utilizes a through-silicon via (TSV) 30, which is a vertical electrical connection (Vertical Interconnect Access, or "via") structure passing completely through silicon chip 10-1. Conventional methods for producing TSV 30 typically involve drilling a hole partially through upper surface 11 of the silicon wafer material from which chip 10-1 is diced, then filling the hole with an electrically conductive material (e.g., Copper or Tungsten), and then grinding the back side of the silicon wafer to expose a lower end portion 32 of TSV 30. During subsequent processing, an upper end portion 31 of TSV 30 is connected by conductor 18-1 to IC 20-1, and lower end portion 32 is connected during package assembly by a solder structure 40 to conductor 18-2. TSV 30 thus forms a vertical interconnect between IC 20-1 and IC 20-2 that minimizes timing delays due to shorter signal paths lengths, and provides a smaller 3D package arrangement over conventional edge-wired 3D package arrangements (i.e., because the package width is effectively defined by the peripheral edge of chips 10-1 and 10-2, and because the absence of an interposer allows for a flatter/thinner profile). In addition, because chip-to-chip connections are disposed between opposing surfaces of chips 10-1 and 10-2 (e.g., by solder structure 40), the TSV 3D package arrangement facilitates a substantially higher number of chip-to-chip connections than is possible using edge-wired 3D package arrangements.

Although TSVs facilitate superior 3D package arrangements, the development of methodologies for testing TSVs has proven to be a challenge. Conventional IC testing is typically conducted during process known as "wafer sort" to verify that the circuitry functions properly before the wafer is diced and the resulting chips are assembled into packages. The TSV production process leads to defects within the TSV which can include voids that produce improper (i.e., high impedance) connections to adjacent devices or interposer layers, thereby requiring that the integrity of each TSV also be tested during wafer sort. Because conventional IC fabrication involves forming the IC on only one side of a silicon wafer, conventional IC testing is typically performed entirely from one side of the silicon wafer using a single probe assembly that applies and detects test signals to/from the IC's contact pads (e.g., contact pads 17 in FIG. 7). In contrast, TSV testing requires verifying that signals are properly passed from one side of the chip to the other, which requires simultaneously accessing both ends the TSVs (e.g., both upper end portion 31 and lower end portion 32 of TSV 30, shown in FIG. 7). Although it is possible to modify existing IC test equipment to configure two test probe arrays that respectively contact both sides of the wafer, this modification is problematic due to the complexity of simultaneously accessing a large number of contact pads disposed on both sides of a wafer.

What is needed is a cost-effective method for testing TSVs that requires minimal modifications to existing IC test equipment.

SUMMARY OF THE INVENTION

The present invention is directed to a method for testing Through-Silicon Vias (TSVs) disposed on a silicon wafer (substrate) in which electron beam is directed onto a surface of the wafer such that a portion of the electron beam is reflected by end portions of the TSVs. The reflected electron beam portion is then detected and converted into beam detection data, which is then compared with stored data to determine the integrity of the TSVs. By utilizing an electron beam to determine the integrity of the TSVs, a TSV testing methodology is provided that greatly simplifies the process of simultaneously accessing both surfaces of a test wafer. That is, the present invention avoids the need for coordinating simultaneous test probe contact on both sides of a test wafer by utilizing a directed electron beam to "probe" one side of the test wafer (e.g., while the second side receives test signals from an IC test probe array or other suitable test fixture).

According to an embodiment of the present invention, the TSV testing method involves applying an alternating test signal (e.g., by way of a test probe) onto one end portion of a TSV while directing the electron beam onto the opposite end portion of the TSV. This approach facilitates determining TSV integrity because, when the TSV is properly formed, the reflected electron beam portion is suitably modulated by the alternating test signal. Conversely, when test TSV is defective (e.g., includes a void or cracks), then the reflected electron beam portion is weakly modulated or not modulated. By comparing the beam detection data with stored data indicating suitable modulation (deflection) of the reflected electron beam portion by the alternating test signal, the present invention facilitates TSV testing without requiring physical contact to both (upper and lower) surfaces of the test wafer.

According to another embodiment of the present invention, the TSV testing method involves applying various signals during different test phases to detect different defect types. During a first phase, the TSV is maintained in either an unpowered or static state (e.g., by either disconnecting the test probe or applying a static voltage signal), and a first electron beam analysis is performed to the determine a mechanical state of the TSV (e.g., that the end surface from which the electron beam is reflected is properly formed and shaped). During second and third phases, the TSV two different alternating signals (e.g., having different frequencies) are applied to the TSV by way of the test probe. By utilizing two different test signals having different frequencies, the present invention facilitates enhanced defect detection, i.e., by facilitating the identification of various types of structural flaws that would act as an RC network—varying the test signal frequency allows for differentiating faults based on impedance. By combining the first phase with at least one of the second and third phases, the TSV testing methodology of the present invention provides sufficient information to determine the integrity of the TSV without requiring physical contact to both surfaces of the test wafer.

According to another embodiment of the present invention, the TSV testing methodology is performed simultaneously with (or immediately before or after) "normal" IC testing during wafer sort. That is, because the TSV testing methodology utilizes the same test probe array used to perform "normal" IC testing, the present invention facilitates simultaneous (or near simultaneous) TSV testing, thereby minimizing both testing time and testing costs.

According to another embodiment of the present invention, the TSV testing method involves applying an electrically resistive coating on the wafer surface onto which the electron beam is directed, and connecting the electrically resistive coating to a fixed voltage source, thereby providing a partially-conductive path between the TSVs and the fixed voltage. In one specific embodiment, selected TSVs are exposed by patterning the electrically resistive coating to define openings.

According to other embodiments of the present invention, the TSV testing method involves directing the electron beam according to various scan patterns that either maximize beam direction tolerances, minimize test time, or are balanced to optimize both parameters. In a first beam directing embodiment, the electron beam is scanned in a raster-type pattern such that that it passes across the entire test wafer surface, thereby maximizing beam direction tolerances by eliminating the need to know where the TSVs are located. In a second beam directing embodiment, the electron beam is precisely positioned only each TSV based on stored targeting data, thereby minimizing test times by avoiding the generation of test data for inconsequential regions of the test wafer (i.e., regions that do not include a TSV). In a third beam directing embodiment, the electron beam is scanned in a limited raster-scan pattern over limited regions of the test wafer known to include one or more TSVs, and then moved from the first limited region to a second limited region. This third approach reduces test time by eliminating the need to scan regions known not to include TSVs, and also relaxes beam targeting tolerances by utilizing limited raster-type scanning patterns.

BRIEF DESCRIPTION OF THE DRAWINGS

These and other features, aspects and advantages of the present invention will become better understood with regard to the following description, appended claims, and accompanying drawings, where:

DETAILED DESCRIPTION

The present invention relates to an improvement in IC testing. The following description is presented to enable one of ordinary skill in the art to make and use the invention as provided in the context of a particular application and its requirements. As used herein, directional terms such as "upper" and "lower" are intended to provide relative positions for purposes of description, and are not intended to designate an absolute frame of reference. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of one or more intervening circuit elements (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
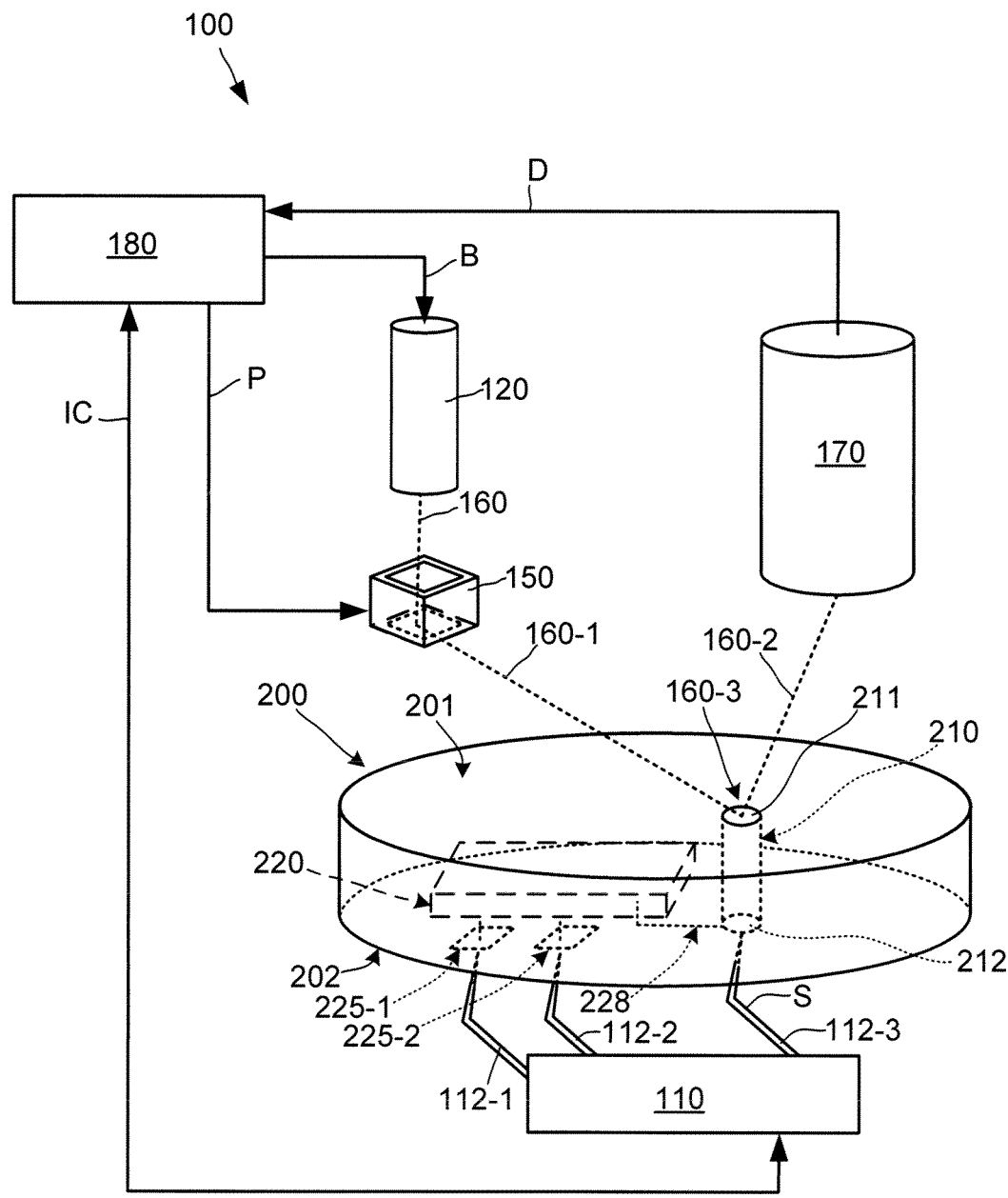
FIG. 1 is a top side perspective view showing a test assembly according to an embodiment of the present invention.

FIG. 1 shows an integrated circuit (IC) test assembly 100 configured to test IC 220 disposed on a silicon wafer (substrate) 200, wherein assembly 100 is modified in accordance with the present invention to also facilitate testing of a Through-Silicon Via (TSV) 210 disposed on silicon wafer 200 during a wafer sort process.

Figure 7:
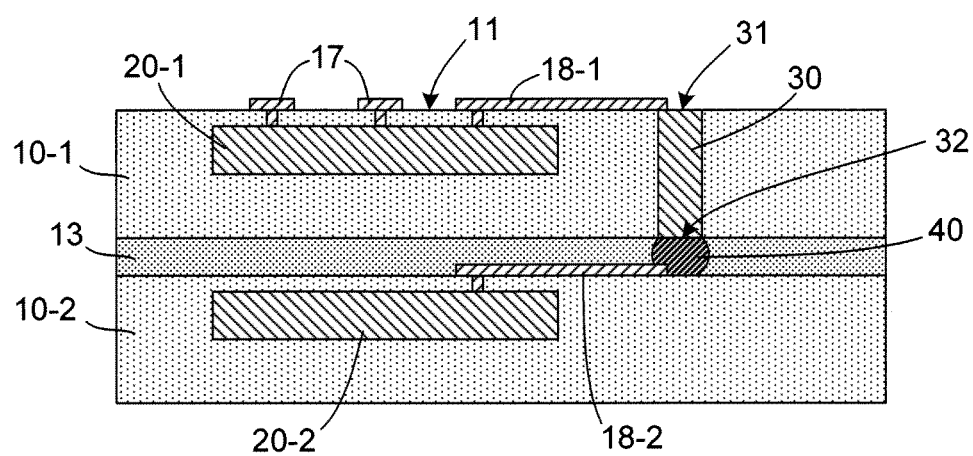
FIG. 7 is a cross-sectional view showing a multi-chip semiconductor device having a TSV 3D package arrangement.

Silicon wafer 200, TSV 210 and IC 220 are substantially identical to that of chip 10-1, which is described above with reference to FIG. 7, but wafer 200 is depicted before the dicing process used to obtain individual IC chips. IC 220 is fabricated on silicon wafer 200 using conventional photolithographic semiconductor processes, and is coupled to contact pads 225-1 and 225-2 that are disposed on lower surface 202. TSV 210 comprises an electrically conductive material (e.g., Copper or Tungsten) inserted into a hole defined in silicon wafer 200 that is subsequently processed using conventional techniques such that TSV 210 extends between an upper end portion 211 exposed on upper wafer surface 201 and a lower end portion 212 exposed on lower wafer surface 202. TSV 210 is connected to IC 220 by way of a conductive wire 228 formed on lower substrate surface 202. In some cases lower end portion 212 of TSV 210 is covered by a passivation layer that separates contact pads 225-1 and 225-2 from IC 220, in which case lower end portion 212 is not exposed on lower surface 202. As defined herein, in either of these cases (i.e., exposed or covered by passivation), lower end portion 212 is referred to as being disposed adjacent to lower surface of wafer 200. Only one IC and only one TSV are shown in FIG. 1 for brevity, and it is understood that in practical applications multiple ICs having multiple contact pads and multiple TSV devices are typically present on a silicon wafer under test.

IC test assembly 100 includes a test probe array 110 and an associated positioning mechanism (not shown) that function in a manner similar to conventional IC testing equipment. Test probe array includes test probes 125-1 and 125-2 that are positioned and arranged to operably abut contact pads 225-1 and 225-2, respectively, when the associated positioning mechanism automatically moves probe array 110 toward silicon wafer 200. Test signals are transmitted between a controller 180 and IC 220 by way of test probes 125-1 and 125-2, with controller 180 configured to determine the integrity of IC 220 based on these test signals according to known techniques.

In accordance with an aspect of the present invention, IC test assembly 100 is modified to facilitate TSV testing by providing an electron beam generation device 120, a direction control device 150, an electron beam detection device 170. As set forth in detail below, electron beam generation device 120 generates an electron beam 160 that is directed by direction control device 150 onto upper surface 201 of wafer 200 such that a portion 160-2 of electron beam 160 is reflected by upper end portion 211 of TSV 210. Direction control of beam 160 is typically provided by orthogonally active electromagnetic coils that allow for control of a directed electron beam portion 160-1 such that an incident end portion 160-3 of directed beam portion 160-1 is coincident with and reflected from upper end portion 211 of TSV 210, thus producing reflected beam portion 160-2 that is directed away from wafer 200. Note that reflected beam portion 160-2 is essentially a continuation of directed beam portion 160-1, but is changed (e.g., modulated or reduced by scattering) by the reflection from upper end portion 211 of said TSV 210. Reflected beam portion 160-2 is then detected by electron beam detection device 170, which also generates beam detection data D corresponding to detected electron beam portion 160-2 (i.e., data indicating the type and amount of change caused by reflection from upper end portion 211) using know techniques. Suitable equipment for implementing electron beam generation device 120, direction control device 150, and electron beam detection device 170 is commercially available. The integrity of TSV 210 is then determined, for example, by comparing beam detection data D with stored data. In one embodiment, this integrity analysis is performed by controller 180, which is modified to receive and compare beam detection data D with stored "known-good TSV" data. When beam detection data D is comparable with the stored "known-good TSV" data, then the integrity (i.e., proper fabrication) of TSV 210 is confirmed. Conversely, when beam detection data D is not comparable, then TSV 210 is deemed to be defective, and that IC 220 is unsuitable for use in an IC device.

Referring to the lower portion of FIG. 1, in accordance with an embodiment of the present invention, IC test assembly 100 is further modified to facilitate TSV testing by accessing lower end 212 of TSV 210 by way of test signals transmitted through IC 220 by way of test probes 112-1 or 112-2, or by modifying test probe array 110 to include an optional test probe 112-3 that is positioned to contact TSV 210 (i.e., when it is exposed on lower wafer surface 202), and controller 180 is modified to process TSV test data in the manner described below using known data processing techniques. That is, when an alternating (test) signal S is applied to an appropriate test node (i.e., lower end portion 212 of TSV 210 by way of optional test probe 125-3, or one of contact pads 225-1 or 225-2 by way of test probes 112-1 and 112-2, respectively) and TSV 210 is formed properly, reflected electron beam portion 160-2 is modulated (i.e., exhibits a varying intensity) in a way that corresponds with the applied alternating signal. Beam detection data D thus generated by detector 170 indicates the integrity of TSV 210 by including values indicating the amount of modulation in reflected electron beam portion 160-2 produced by the transmission of alternating signal S from test probe 112-3 through TSV 210 to upper TSV end portion 211. That is, proper TSV formation is determined when beam detection data D includes values indicating a relatively strong modulation pattern. Conversely, when beam detection data D includes values indicating a relatively weak or non-existent modulation pattern, then the analysis of the resultant data D provides an indication that TSV 210 is formed improperly (e.g., that TSV 210 includes a void or other defect that impedes or prevents the transmission of alternating signal S to upper end portion 211).

FIGS. 2(A) to 2(D) are simplified cross-sectional views showing relevant portions of assembly 100 during operation in accordance with another embodiment of the present invention.

Figure 2A:
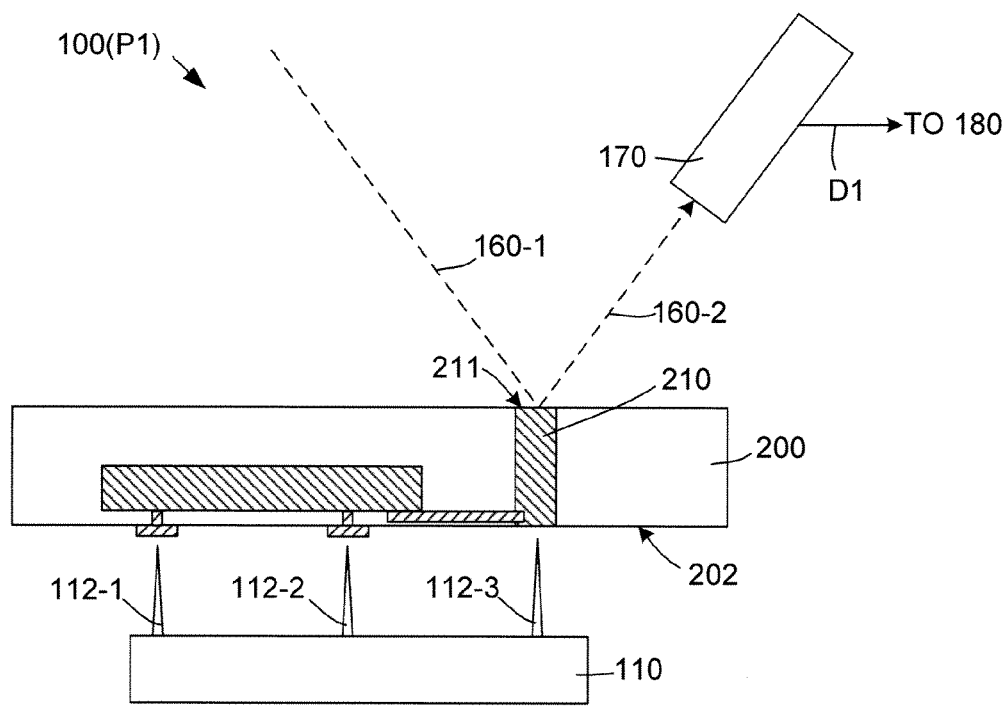
FIGS. 2(A), 2(B), 2(C) and 2(D) are simplified partial side views showing the test assembly of FIG. 1 during operation according to another embodiment of the present invention.

FIG. 2(A) illustrates test assembly 100 and test wafer 200 during an initial phase P1 (indicated by "100(P1)", which refers to assembly 100 during phase P1). In one specific embodiment, phase P1 is performed before test probe array 110 is moved into contact with wafer 210 (i.e., such that test probes 112-1 to 112-3 are separated from lower surface 202 of wafer 200), whereby TSV 210 is maintained in an unpowered state. Directed electron beam portion 160-1 is directed toward upper surface 201 of substrate 200 such that it reflects off of upper TSV end portion 211, and such that reflected electron beam portion 160-2 is directed to electron beam detection device 170, which then generates associated beam detection data D1 that is transmitted to controller 180 for processing. Note that in this case reflected electron beam portion 160-2 is used to analyze the mechanical state of TSV 210. In an alternative to the unpowered test phase, a static signal (e.g., 0V DC) is applied to TSV 210 by way of test probe array 110 (i.e., by contacting lower TSV end portion 212 in the manner described below with reference to FIG. 2(B) and maintaining the test probe at the fixed voltage state).

Figure 2B:
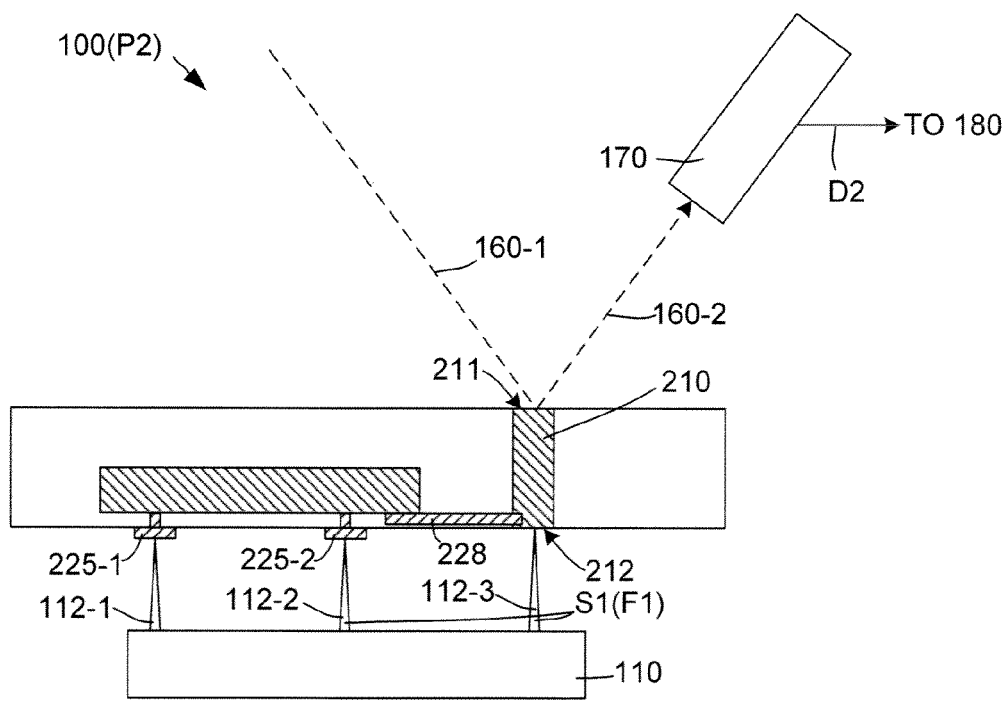

FIG. 2(B) illustrates test assembly 100 during a second phase P2 after test probe array 110 is moved into contact with wafer 210 in order to access lower end portion 212 of TSV 210 (i.e., such that test probes 112-1 and 112-2 abut contact pads 225-1 and 225-2, and/or optional test probe 112-3 contacts lower end 212 of TSV 210, when it is exposed). During the second phase, an alternating signal S1 having a frequency F1 is operably coupled onto second end portion 212 (e.g., by way of test probe 112-2 through IC 220 and conductive wire 228, or by contact between optional test probe 112-3 and exposed second end portion 212), whereby signal S1 is transmitted by the body of TSV 210 (i.e., when there are no defects that prevent transmission) to upper end portion 211. At the same time, directed electron beam portion 160-1 is directed toward upper surface 201 of substrate 200 such that reflected electron beam portion 160-2 is reflected off of upper TSV end portion 211. Note that in this case reflected electron beam portion 160-2 is modulated by alternating signal S1 when TSV is properly constructed (e.g., the modulation of reflected electron beam portion 160-2 is consistent with frequency F1). In a manner similar to that described above, reflected electron beam portion 160-2 is then detected by electron beam detection device 170, which then generates associated beam detection data D2 that is transmitted to controller 180 for processing. External voids or cracks may be more easily detected during the second phase than the first phase. That is, testing of powered and active TSVs as set forth above during the second test phase allows for detection of flaws (e.g., voids or cracks) in the structure due to impedance, which is reflected in beam detection data D2.

Figure 2C:
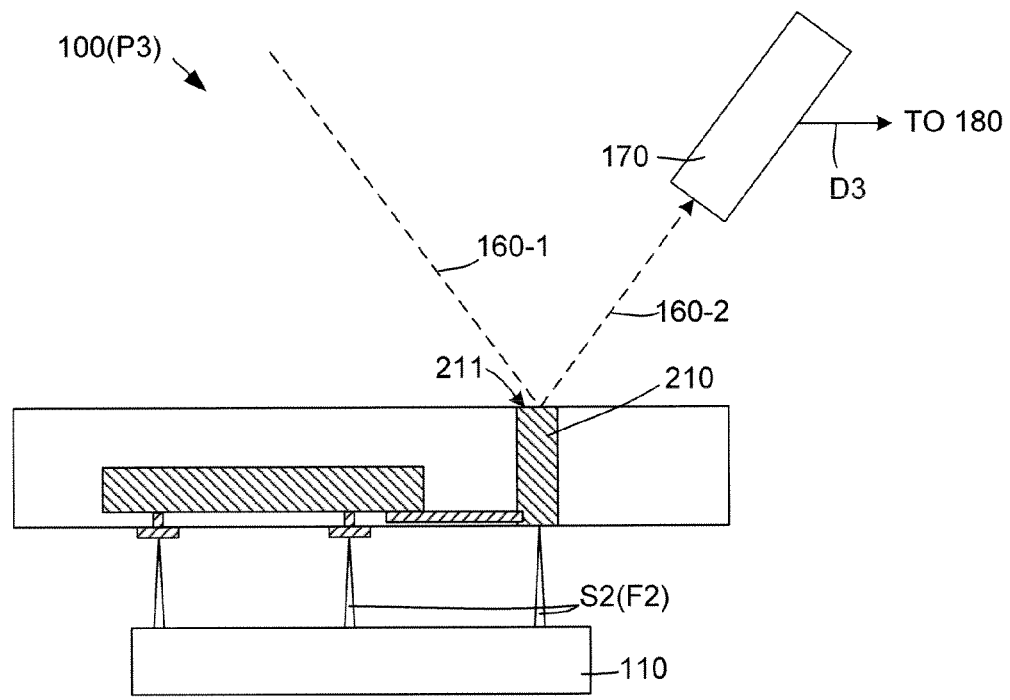

FIG. 2(C) illustrates test assembly 100 during an optional third phase P3 during which a second alternating signal S2 is applied to TSV 210, where second alternating signal S2 has a frequency F2 that is different from (i.e., greater than or less than) frequency F1 used during the second TSV testing phase (described above with reference to FIG. 2(B)). As in the previous phases, directed electron beam portion 160-1 is reflected from upper end portion 211 of TSV 210 during the third phase, and reflected electron beam portion 160-2 is detected by electron beam detection device 170, which then generates associated beam detection data D3 that is transmitted to controller 180 for processing in the manner described above. By utilizing test signals S1 and S2 having different frequencies, the present invention facilitates additional defect detection of various structural flaws that act like RC networks, where varying the test signal frequency allows for differentiating faults based on impedance.

Figure 2D:
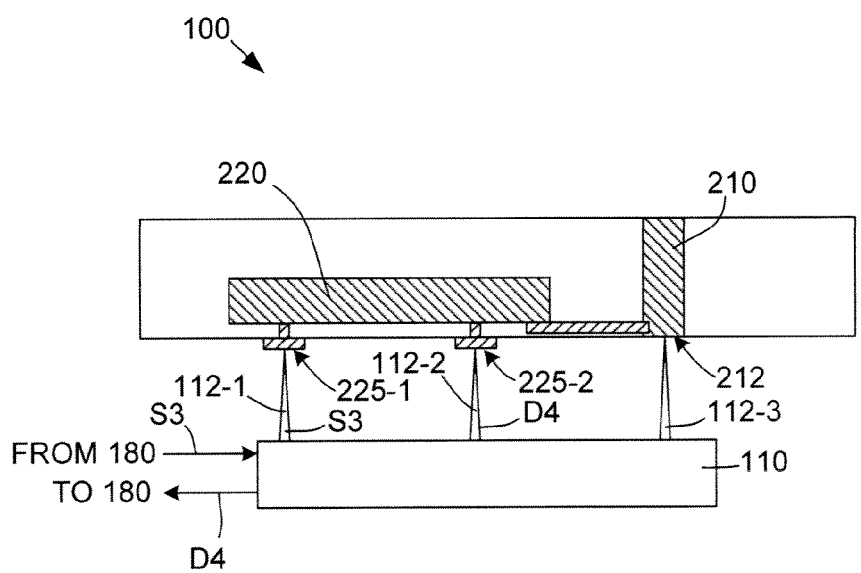

FIG. 2(D) illustrates test assembly 100 during a standard IC testing procedure that is optionally performed during TSV testing (i.e., during phases P1 to P3, described above), or is performed after TSV testing is completed. In accordance with known techniques, test signal S3 is applied to IC 220 through an associated test probe (e.g., test probe 112-1), and test data D4 is collected by way of an associated test probe (e.g., test probe 112-2) and sent to controller 180 (shown in FIG. 1) for processing. Another advantage of the TSV testing approach of the present invention is that it utilizes existing IC test equipment (e.g., test probe array 110 and its associated positioning mechanism) that facilitates simultaneously performing both TSV testing and IC testing. That is, even when test probe array 110 is modified to include test probe 112-3, both IC testing and TSV testing are enabled simultaneously (i.e., because the operation used to position test probe array 110 causes optional test probe 112-3 to be brought into contact with lower end portion 211-2 of TSV 210 at the same time test probes 112-1 and 112-2 are brought into contact with IC contact pads 225-1 and 225-2). This shared use of test probe array 110 saves both time and cost due to the minimal modification needed to implement TSV testing, and because no additional effort is needed to make the required test probe contacts.

Figure 3:
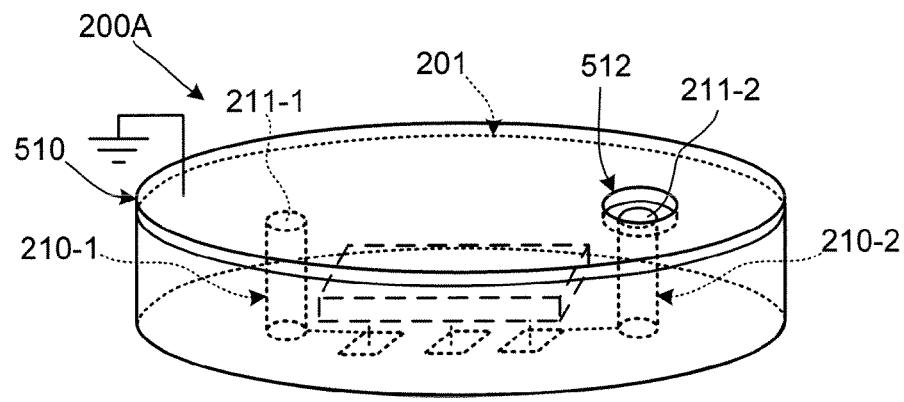
FIG. 3 is a top side perspective view showing a test wafer modified in accordance with another embodiment of the present invention.

FIG. 3 is a simplified perspective view showing a wafer 200A that is processed in accordance with an alternative embodiment in which an electrically resistive coating 510 is applied onto upper surface 201 of wafer 200. During testing, electrically resistive coating 510 is connected to ground (or another fixed voltage source) while the electron beam (not shown) is directed onto upper end portions 211-1 and 211-2 of TSVs 210-1 and 210-2 in the manner described herein. Electrically resistive coating 510 provides for a partially-conductive path to the fixed (static) voltage (typically ground or 0 Volts). The sheet resistive effect provided by coating 510 provides for pull-up or pull-down of TSV 210-1 to the constant voltage supply. In one embodiment, coating 510 is patterned to define an annular opening 512 that exposes upper end portion 211-2 of TSV 210-2, whereby coating 510 is patterned to avoid this test node (e.g., when TSV 210-2 is used to supply power, or when the pull-down voltage is otherwise undesirable). In one embodiment, coating 510 is removed after testing and prior to subsequent processing or manufacturing procedures. Such contact with the test nodes reduces capacitive coupling of open test nodes and provides increased fault detection.

According to alternative embodiments, TSV testing is performed using various scanning strategies, some of which are described below with reference to FIGS. 4 to 6.

Figure 4:
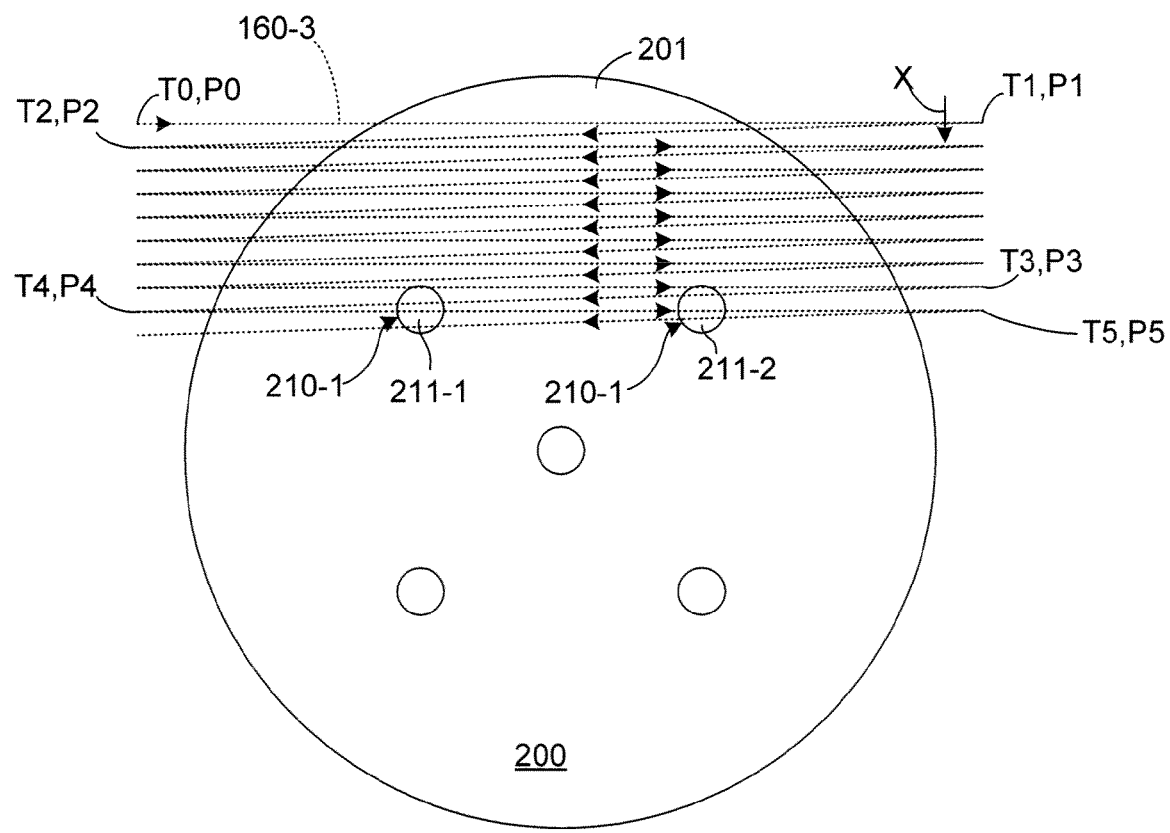
FIG. 4 is a top plan view showing a test wafer during TSV testing utilizing a raster-type scan pattern according to another embodiment of the present invention.

FIG. 4 is a simplified top view showing silicon wafer 200 during TSV testing in which electron beam 160 is scanned in a raster-type pattern across upper surface 201 of silicon wafer 200. This operating mode is implemented by causing direction control device 150 (see FIG. 1) to regulate the electron beam such that incident beam point 160-3 traces a raster-type scan pattern, such as that indicated by the dashed-line arrows in FIG. 4, over upper substrate surface 201. Specifically, with the incident beam point directed onto position P0 at time T0, the direction control device causes the electron beam to sweep across upper substrate surface 201 (from left to right in the figure) at a predetermined rate such that the incident beam point is directed onto position P1 at time T1. As indicated by the dashed-line arrows, the raster-type scan pattern involves sweeping the incident beam point along a path that crosses the entirety of upper surface 201 (e.g., from one extreme of field of view to the opposite extreme). Next, the direction control device causes the electron beam to sweep back across upper substrate surface 201 (i.e., from right to left in the figure) with an incremental displacement in the X-direction and at a predetermined rate until the incident beam point is directed onto position P2 at time T2. This sweep is repeated with incremental changes in the relative position between incident beam point and upper surface 201 such that the incident beam point passes at least once across the upper end portions of each TSV disposed on wafer 200. For example, reflected electron beam data indicating the integrity of TSVs 210-1 and 210-2 is generated as the electron beam point is swept over end portions 211-1 and 211-2 as the electron beam moves from point P3 at time T3 to point P4 at time T4, and as the electron beam moves from point P4 to point P5 at time T5. An advantage provided by utilizing this full raster-type scan approach is that this approach maximizes beam positioning tolerance (i.e., by scanning the entirety of upper surface 201, the full scan approach assures that data is collected for all TVSs disposed thereon without having to know the specific locations of the TSVs).

Figure 5:
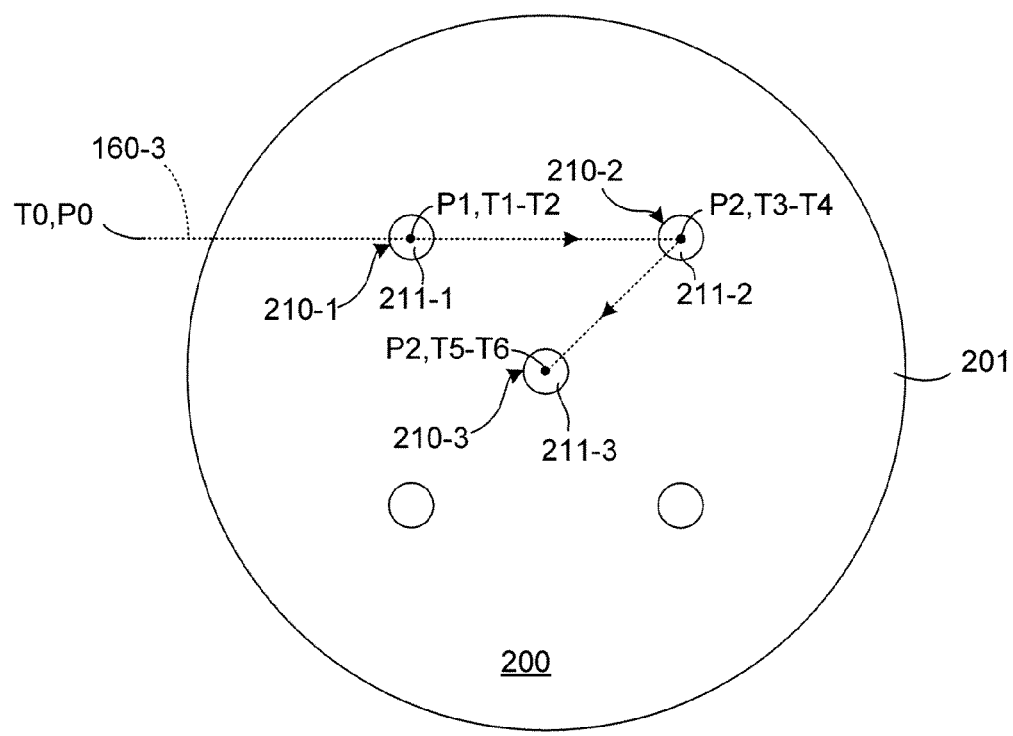
FIG. 5 is a top plan view showing a test wafer during TSV testing utilizing a directed beam approach according to another embodiment of the present invention.

FIG. 5 is a simplified top view showing silicon wafer 200 during TSV testing in which the position (coordinates) of each TSV is known, so the electron beam is regulated such that the incident beam portion is positioned only on the upper end portion of each TSV, where it is maintained for a predetermined test time period. This operating mode is implemented by causing direction control device 150 (see FIG. 1) to regulate the electron beam such that incident beam point 160-3 is moved over upper substrate surface 201 between known TSV locations, such as that indicated by the dashed-line arrows in FIG. 5. Specifically, with the incident beam point directed onto position P0 at time T0, the direction control device causes the electron beam to move across upper substrate surface 201 such that the incident beam point is directed onto position P1 at time T1, where position P1 coincides with upper end portion 211-1 of TSV 210-1. After maintaining incident beam point at position P1 for a predetermined time period (i.e., time T1 to time T2, e.g., one second), the incident beam point is moved from position P1 to position P2 at time T3, where position P2 coincides with upper end portion 211-2 of TSV 210-2. After maintaining incident beam point at position P2 for the predetermined test time period (i.e., time T3 to time T4), the incident beam point is moved on from position P2 to position P3 at time T5, where it is maintained until time T6. This directed beam pattern is repeated for each TSV disposed on wafer 200. An advantage provided by utilizing this directed-type pattern is that it avoids extended scanning across areas that do not include TSVs, thereby reducing test times.

Figure 6:
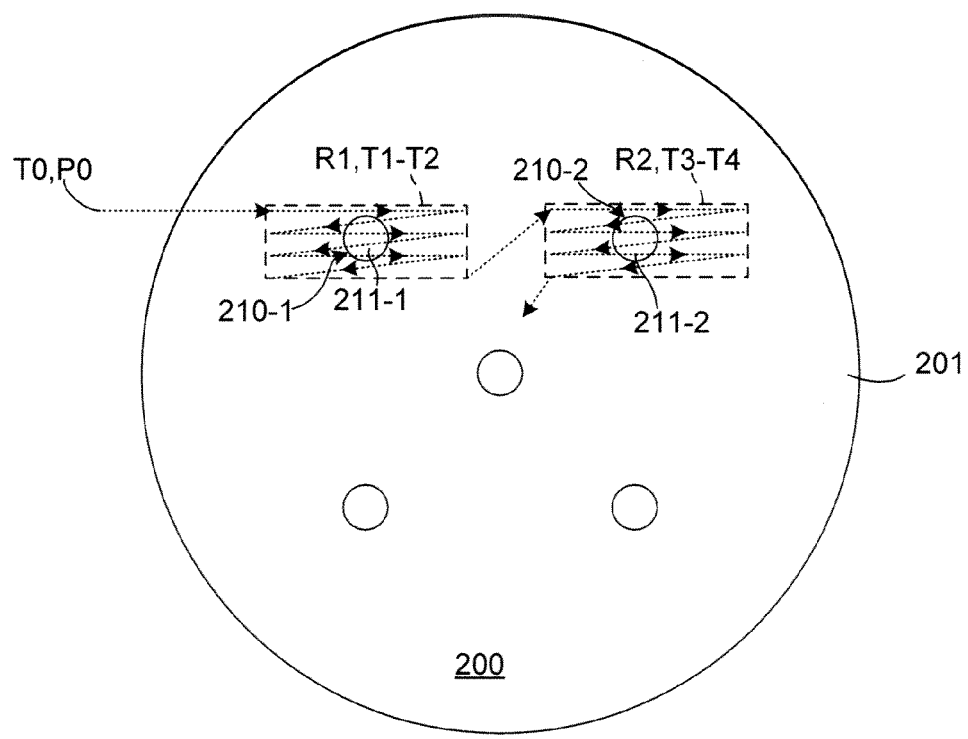
FIG. 6 is a top plan view showing a test wafer during TSV testing utilizing a limited raster-type scan pattern approach according to another embodiment of the present invention.

FIG. 6 is a simplified top view showing silicon wafer 200 during a third TSV testing approach that effectively combines a raster-type scanning approach similar to that described above with reference to FIG. 4 with a directional scanning approach similar to that described above with reference to FIG. 5. That is, the third approach utilizes a scan strategy in which incident beam portion 161-3 is moved from an initial position P0 at time T1 to a first limited wafer region R1, and then caused to scan (e.g., using a limited raster-type scan pattern, such as that indicated by the dashed-line arrows in region R1), where region R1 is known to include a first TSV (e.g., TSV 210-1). At time T2, when the first region scan is completed, the incident beam point is then moved to a second limited wafer region R2 known to include a second TSV (e.g., TSV 210-2), and regulated to perform another limited raster-type scan between times T3 and T4 before moving on to a next region. In addition to raster-type scanning patterns, alternate scan patterns may be utilized to increase scanning efficiency. The third approach thus combines some of the tolerance benefits of the first approach with some of the efficiency of the second approach.

Although the present invention has been described with respect to certain specific embodiments, it will be clear to those skilled in the art that the inventive features of the present invention are applicable to other embodiments as well, all of which are intended to fall within the scope of the present invention. For example, the test arrangement described herein can be modified such that the test wafer is upside-down (i.e., with test probes are applied to the upward-facing wafer surface, and the electron beam directed against the downward-facing wafer surface).

The invention claimed is:

1. A method for testing a Through Silicon Via (TSV) disposed on and extending through a substrate such that the TSV includes a first end portion exposed on a first surface of said substrate, and a second end portion disposed adjacent to a second surface of said substrate, the method comprising:
accessing the second end portion of said TSV by way of a test probe;
applying a first alternating signal to said TSV through said test probe, said first alternating signal having a first frequency;
directing an electron beam onto said first surface of said substrate such that a portion of said electron beam is reflected by said first end portion of said TSV;
detecting the reflected electron beam portion and generating beam detection data corresponding to the detected electron beam portion; and
determining an integrity of said TSV by comparing the beam detection data with known-good TSV data, wherein determining the integrity of said TSV comprises comparing a first modulation amount included in the reflected electron beam portion, said first modulation amount being produced by said first alternating signal, with a first known-good TSV data value.

2. The method of claim 1, further comprising applying a second alternating signal to said TSV through said test probe, said second alternating signal having a second frequency that is different from said first frequency, wherein determining the integrity of said TSV further comprises comparing a second modulation amount in the reflected electron beam portion that is produced by said second alternating signal with one of a second known-good TSV data value and the first modulation amount.

3. The method of claim 1, wherein directing said electron beam onto said first surface of said substrate comprises scanning said electron beam such that an incident portion of said electron beam passes in a raster-type pattern across said first surface.

4. The method of claim 1, wherein directing said electron beam onto said first surface of said substrate comprises positioning the electron beam such that an incident portion of said electron beam is maintained on said first end portion during a first time period.

5. The method of claim 1, wherein directing said electron beam onto said first surface of said substrate comprises scanning said electron beam in a pattern across a first region of said first surface, then scanning said electron beam in said pattern across a second region of said first surface.

6. A method for testing a Through Silicon Via (TSV) disposed on and extending through a substrate such that the TSV includes a first end portion exposed on a first surface of said substrate, and a second end portion disposed adjacent to a second surface of said substrate, the method comprising:
directing an electron beam onto said first surface of said substrate such that a portion of said electron beam is reflected by said first end portion of said TSV;
applying an electrically resistive coating onto said first surface of said substrate;
connecting the electrically resistive coating to a fixed voltage source while directing said electron beam onto said first end portion;
detecting the reflected electron beam portion and generating beam detection data corresponding to the detected electron beam portion; and
determining an integrity of said TSV by comparing the beam detection data with known-good TSV data.

7. The method of claim 6, wherein applying the electrically resistive coating comprises patterning the electrically resistive coating to define an opening positioned such that said first end portion is exposed through said opening.

8. The method of claim 1, wherein directing said electron beam onto said first surface of said substrate comprises scanning said electron beam such that an incident portion of said electron beam passes in a raster-type pattern across said first surface.

9. The method of claim 6, wherein directing said electron beam onto said first surface of said substrate comprises positioning the electron beam such that an incident portion of said electron beam is maintained on said first end portion during a first time period.

10. The method of claim 6, wherein directing said electron beam onto said first surface of said substrate comprises scanning said electron beam in a pattern across a first region of said first surface, then scanning said electron beam in said pattern across a second region of said first surface.

* * * * *